(12) United States Patent
Sakui et al.

(10) Patent No.: US 10,916,313 B2
(45) Date of Patent: Feb. 9, 2021

(54) APPARATUS AND METHODS INCLUDING ESTABLISHING A NEGATIVE BODY POTENTIAL IN A MEMORY CELL

(71) Applicant: MICRON TECHNOLOGY, INC., Boise, ID (US)

(72) Inventors: Koji Sakui, Tokyo (JP); Mark Hawes, Boise, ID (US); Toru Tanzawa, Tokyo (JP); Jeremy Binfet, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/574,585

(22) Filed: Sep. 18, 2019

(65) Prior Publication Data
US 2020/0143894 A1 May 7, 2020

Related U.S. Application Data

(62) Division of application No. 16/035,933, filed on Jul. 16, 2018, now Pat. No. 10,453,538, which is a
(Continued)

(51) Int. Cl.
*G11C 16/26* (2006.01)
*G11C 7/04* (2006.01)
(Continued)

(52) U.S. Cl.
CPC .......... *G11C 16/26* (2013.01); *G11C 7/04* (2013.01); *G11C 16/0483* (2013.01); *G11C 16/08* (2013.01); *G11C 16/14* (2013.01); *G11C 16/20* (2013.01); *G11C 16/30* (2013.01); *G11C 16/32* (2013.01); *G11C 16/3418* (2013.01); *G11C 16/3427* (2013.01); *H01L 27/115* (2013.01);
(Continued)

(58) Field of Classification Search
CPC ....... G11C 16/26; G11C 7/04; G11C 16/0483; G11C 16/08; G11C 16/14; G11C 16/20
USPC ........................... 365/185.01–185.33
See application file for complete search history.

(56) References Cited

U.S. PATENT DOCUMENTS

7,251,179 B2   7/2007 Ohsawa
8,271,692 B1   9/2012 Dinh et al.
(Continued)

FOREIGN PATENT DOCUMENTS

JP   03171768 A   7/1991
JP   3029396 B2   4/2000
(Continued)

OTHER PUBLICATIONS

T. Shino, et al., "Operation Voltage Dependence of Memory Cell Characteristics in Fully Depleted Floating-Body Cell," IEEE Transactions of Electron Devices, vol. 52, No. 10., Oct. 2005, pp. 2220-2226.
(Continued)

*Primary Examiner* — Harry W Byrne
(74) *Attorney, Agent, or Firm* — Dicke, Billig & Czaja, PLLC

(57) ABSTRACT

Apparatus configured to establish a negative potential in a body of a memory cell during an access operation of another memory cell, and methods of operating such an apparatus, as well as apparatus configured to establish a negative potential in a body of a memory cell in response to a timer, or before a sensing operation of the memory cell.

13 Claims, 13 Drawing Sheets

Related U.S. Application Data division of application No. 15/350,229, filed on Nov. 14, 2016, now Pat. No. 10,049,750.

(51) Int. Cl.

| | |
|---|---|
| *G11C 16/30* | (2006.01) |
| *G11C 16/34* | (2006.01) |
| *G11C 16/20* | (2006.01) |
| *H01L 27/11519* | (2017.01) |
| *H01L 27/11529* | (2017.01) |
| *H01L 27/11556* | (2017.01) |
| *G11C 16/04* | (2006.01) |
| *G11C 16/08* | (2006.01) |
| *G11C 16/14* | (2006.01) |
| *G11C 16/32* | (2006.01) |
| *H01L 27/115* | (2017.01) |

(52) U.S. Cl.
CPC .. *H01L 27/11519* (2013.01); *H01L 27/11529* (2013.01); *H01L 27/11556* (2013.01)

(56) References Cited

U.S. PATENT DOCUMENTS

| | | |
|---|---|---|
| 8,363,466 B2 | 1/2013 | Shinozaki et al. |
| 9,064,577 B2 | 6/2015 | Zhao et al. |
| 9,171,625 B2 | 10/2015 | Sakui et al. |
| 2002/0149974 A1 | 10/2002 | Sato et al. |
| 2003/0189859 A1 | 10/2003 | Takahashi et al. |
| 2004/0170063 A1 | 9/2004 | Tsai et al. |
| 2005/0001232 A1* | 1/2005 | Bhattacharyya ........ G11C 11/40 257/133 |
| 2005/0001243 A1* | 1/2005 | Yaoi ................ G11C 16/3454 257/213 |
| 2005/0002258 A1* | 1/2005 | Iwase .................... B82Y 10/00 365/222 |
| 2005/0285626 A1 | 12/2005 | Lin |
| 2009/0046531 A1 | 2/2009 | Noh et al. |
| 2011/0310666 A1 | 12/2011 | Miida et al. |
| 2012/0099391 A1 | 4/2012 | Park |
| 2013/0015517 A1* | 1/2013 | Widjaja ................ G11C 11/404 257/316 |
| 2013/0258785 A1 | 10/2013 | Sakui |
| 2014/0160851 A1 | 6/2014 | Zhao et al. |
| 2015/0063037 A1 | 3/2015 | Lee et al. |
| 2016/0005750 A1* | 1/2016 | Widjaja ................ G11C 11/404 257/316 |
| 2019/0006013 A1 | 1/2019 | Lee |

FOREIGN PATENT DOCUMENTS

| | | |
|---|---|---|
| JP | 2011-519462 A | 7/2011 |
| WO | 2010/125695 | 11/2010 |
| WO | 2014/089338 | 6/2014 |

OTHER PUBLICATIONS

T. Ohsawa, et al., "Memory Design Using a One-Transistor Gain Cell on SOI," IEEE Journal of Solid-State Circuits, vol. 37, No. 11, Nov. 2002, pp. 1510-1522.

T. Tanaka, et al., "A 768Gb 3b/cell 3D-Floating-Gate NAND Flash Memory," 2016 IEEE International Solid-State Circuits Conference, Feb. 2016, pp. 1-26.

K. Parat, et al., "A Flotating Gate Based NAND Technology With CMOS Under Array," 2015 IEEE, IEDM 15-48, pp. 1-4.

\* cited by examiner

APPARATUS AND METHODS INCLUDING ESTABLISHING A NEGATIVE BODY POTENTIAL IN A MEMORY CELL

This Application is a Divisional of U.S. application Ser. No. 16/035,933, titled "APPARATUS AND METHODS INCLUDING ESTABLISHING A NEGATIVE BODY POTENTIAL IN A MEMORY CELL," filed Jul. 16, 2018 (allowed), which is a Divisional of U.S. application Ser. No. 15/350,229, titled "METHODS INCLUDING ESTABLISHING A NEGATIVE BODY POTENTIAL IN A MEMORY CELL," filed Nov. 14, 2016, now U.S. Pat. No. 10,049,750, issued on Aug. 14, 2018, which are commonly assigned and incorporated herein by reference.

TECHNICAL FIELD

The present disclosure relates generally to memory and, in particular, in one or more embodiments, the present disclosure relates to apparatus and methods including establishing a negative body potential in a memory cell, e.g., before performing a sensing operation.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of data storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

DETAILED DESCRIPTION

Figure 1:
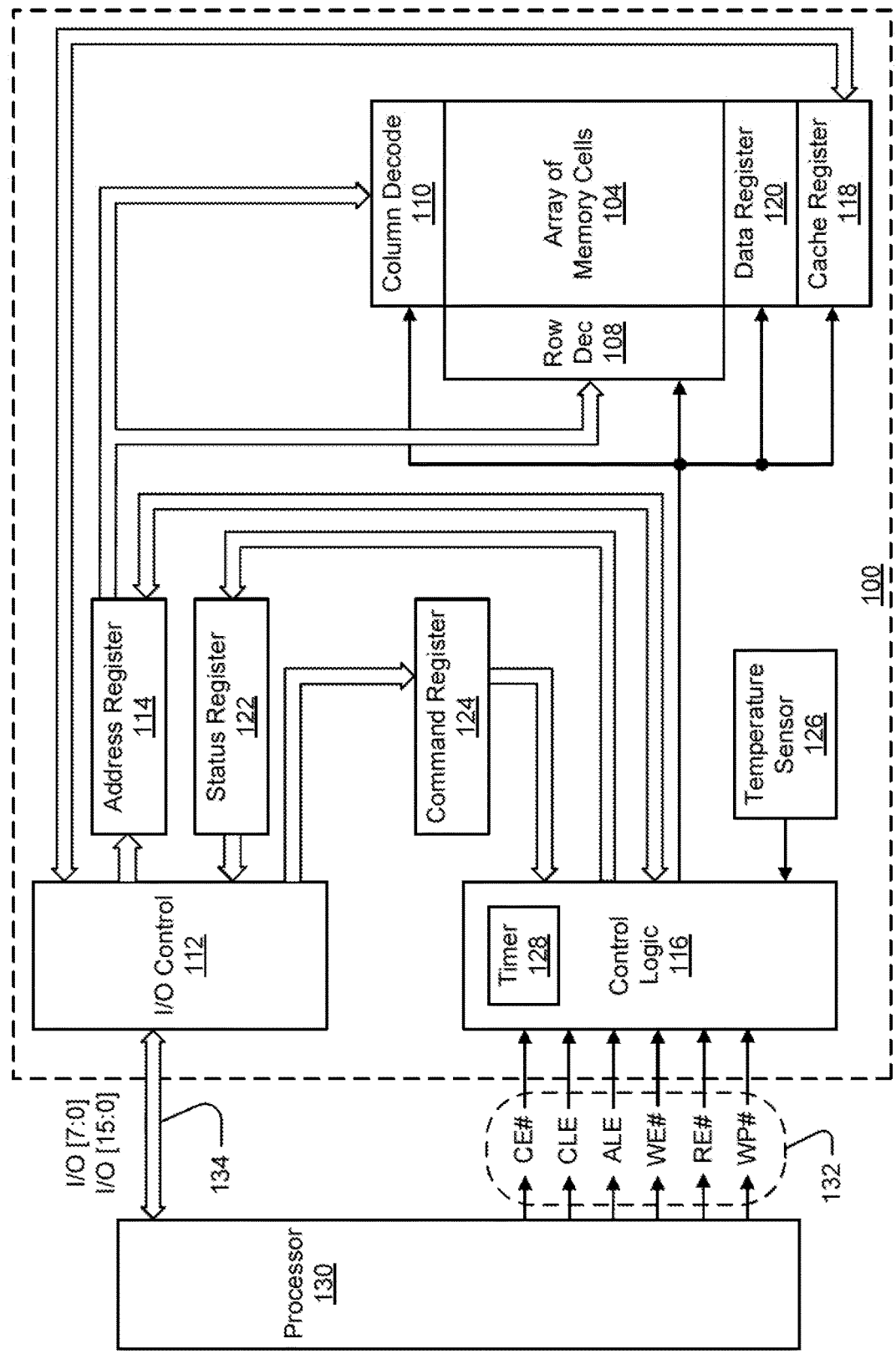
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

It is postulated that negative ions exist between gate stacks of memory cells and isolating dielectric due to contamination during the formation of the dielectric, e.g., silicon dioxide ($SiO_2$). These ions may be mobile, and may be absorbed onto or near the body of the memory cells, e.g., a semiconductor pillar in some memory cell structures, as a stable state after erasure or after long periods of data retention without access. Concentration of these superfluous ions, e.g., near an interface between a gate dielectric of an adjacent memory cell and its body, can influence the effective threshold voltage of that memory cell, which can result in errors in sensing its intended data value. Various embodiments seek to mitigate this phenomena by establishing a negative body potential prior to sensing that memory cell, e.g., immediately prior to sensing that memory cell, on a periodic basis, or during access operations on other memory cells.

FIG. 1 is a simplified block diagram of a first apparatus, in the form of a memory (e.g., memory device) 100, in communication with a second apparatus, in the form of a processor 130, and a third apparatus, in the form of a power supply 136, as part of a fourth apparatus, in the form of an electronic system, according to an embodiment. For some embodiments, the power supply 136 may be external to an electronic system containing the processor 130 and the memory device 100. Some examples of electronic systems include personal computers, personal digital assistants (PDAs), digital cameras, digital media players, digital recorders, games, appliances, vehicles, wireless devices, mobile telephones, removable memory modules and the like. The processor 130, e.g., a controller external to the memory device 100, may represent a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are arranged in strings of series-connected memory cells.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller, such as an internal controller (e.g., control logic 116), controls access to the array of memory cells 104 in response to the commands and generates status information for the external processor 130, i.e., control logic 116 may be configured to perform access operations (e.g., erase operations, programming operations, verify operations and read operations) in accordance with embodiments described herein. The control logic 116 is in communication with row decode circuitry 108 and column decode circuitry 110 to control the row decode circuitry 108 and column decode circuitry 110 in response to the addresses.

The control logic 116 is also in communication with a cache register 118 and data register 120. Cache register 118 latches data, either incoming or outgoing, as directed by control logic 116 to temporarily store data while the array of memory cells 104 is busy writing or reading, respectively, other data. During a programming operation (e.g., often referred to as a write operation), data is passed from the cache register 118 to the data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

The control logic 116 may further be in communication with temperature sensor 126. Temperature sensor 126 may sense a temperature of the memory device 100 and provide an indication to the control logic 116 representative of that temperature, such as some voltage or resistance level. Some examples of a temperature sensor 126 might include a thermocouple, a resistive device, a thermistor or an infrared sensor. Alternatively, temperature sensor 126 may be external to memory device 100 and in communication with the external processor 130. In this configuration, temperature sensor 126 may provide an indication of ambient temperature rather than device temperature. Processor 130 could communicate the indication representative of the temperature to the control logic 116, such as across input/output (I/O) bus 134 as a digital representation.

The control logic 116 may further be in communication with a timer 128. The timer 128 may be configured to toggle the logic level of an output signal periodically, e.g., a periodic programmable interval timer. Such programmable interval timers are well known. For example, the timer 128 may normally provide an output signal having a logic low level, and may briefly toggle the output signal, e.g., for one clock cycle, to a logic high level at intervals of some particular elapsed time, e.g., every 10 minutes. Subsequent to toggling the output signal, the timer 128 may return the output signal to its normal logic level. The interval may be adjustable. Alternatively, the timer 128 may represent a counter configured to provide a count value representative of an elapsed time, e.g., by counting cycles of a clock signal. Such operation of counters is well known. In addition, timer 128 may be external to memory device 100 and in communication with the external processor 130.

Memory device 100 receives control signals at control logic 116 from processor 130 over a control link 132. The control signals may include a chip enable CE#, a command latch enable CLE, an address latch enable ALE, a write enable WE#, a read enable RE#, and a write protect WP#. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
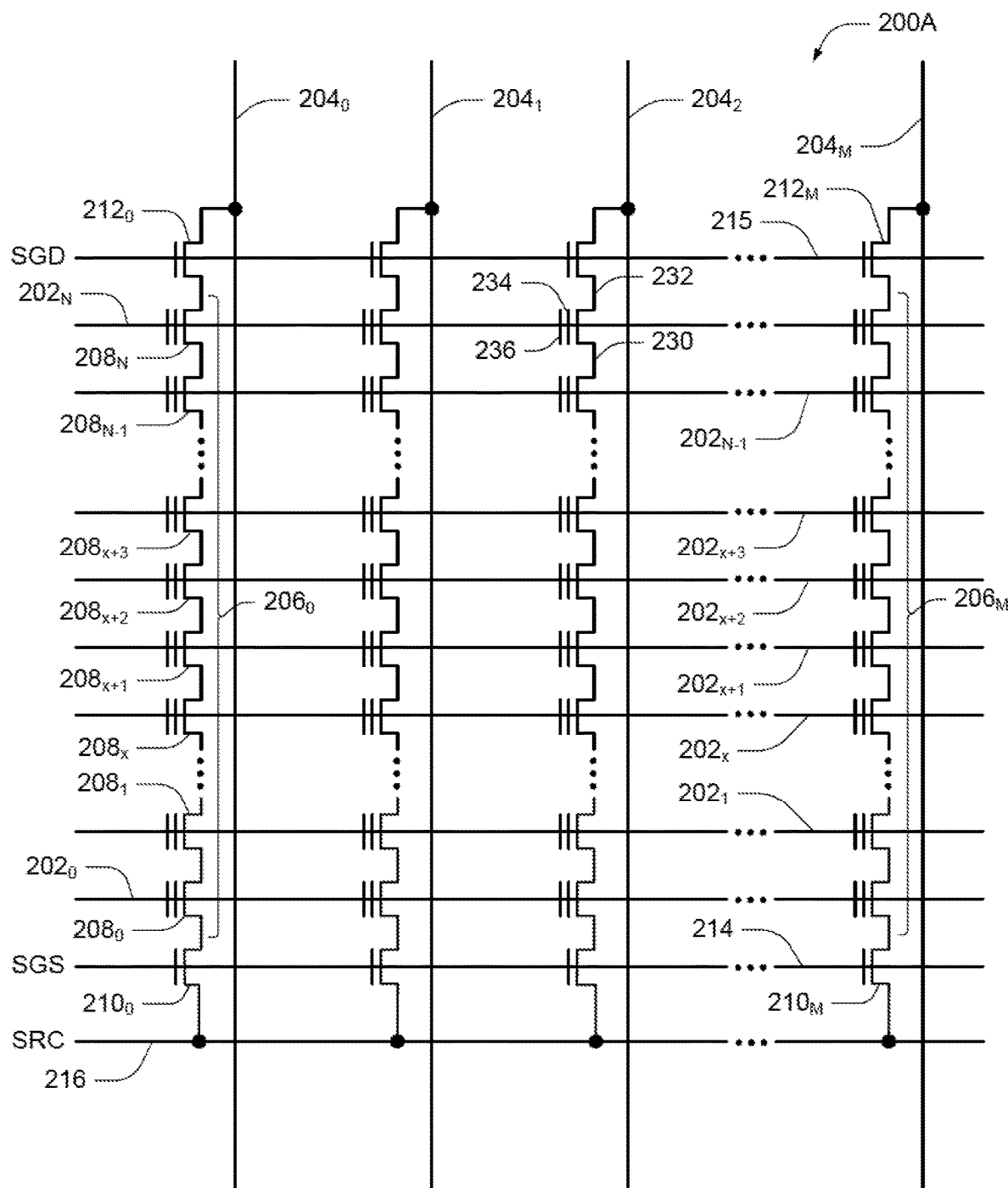
FIGS. 2A-2C are schematics of portions of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $202_0$ to $202_N$, and a data line, such as bit line 204. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells, such as one of NAND strings $206_0$ to $206_M$. Each NAND string 206 might be connected (e.g., selectively connected) to a common source 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line, and select gates $212_0$ to $212_M$ might be commonly connected to a select line 215, such as a drain select line. Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the common bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source 230 and a defined drain 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Figure 2B:
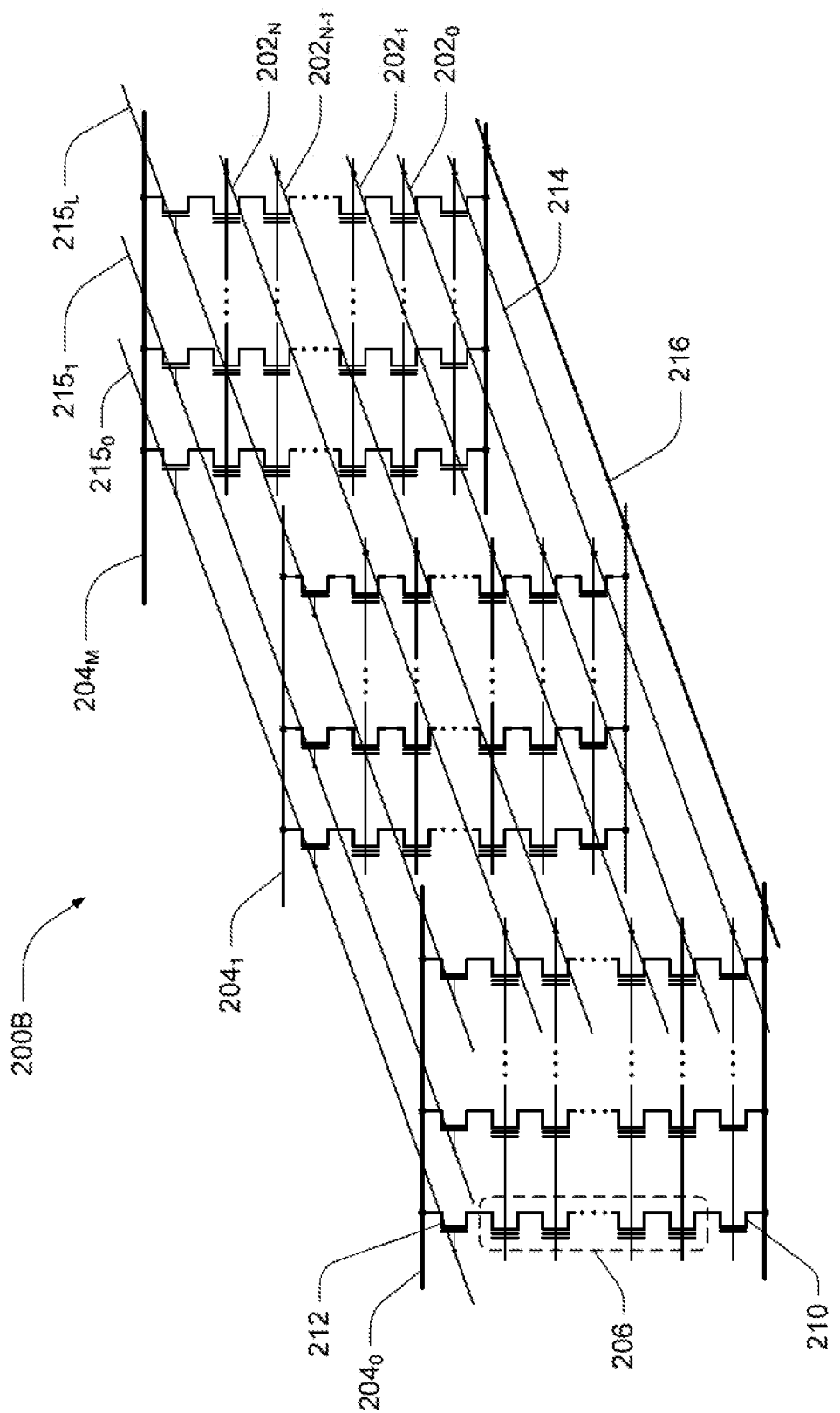

FIG. 2B is another schematic of a portion of an array of memory cells 200B as could be used in a memory of the type described with reference to FIGS. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a body (e.g., channel) region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
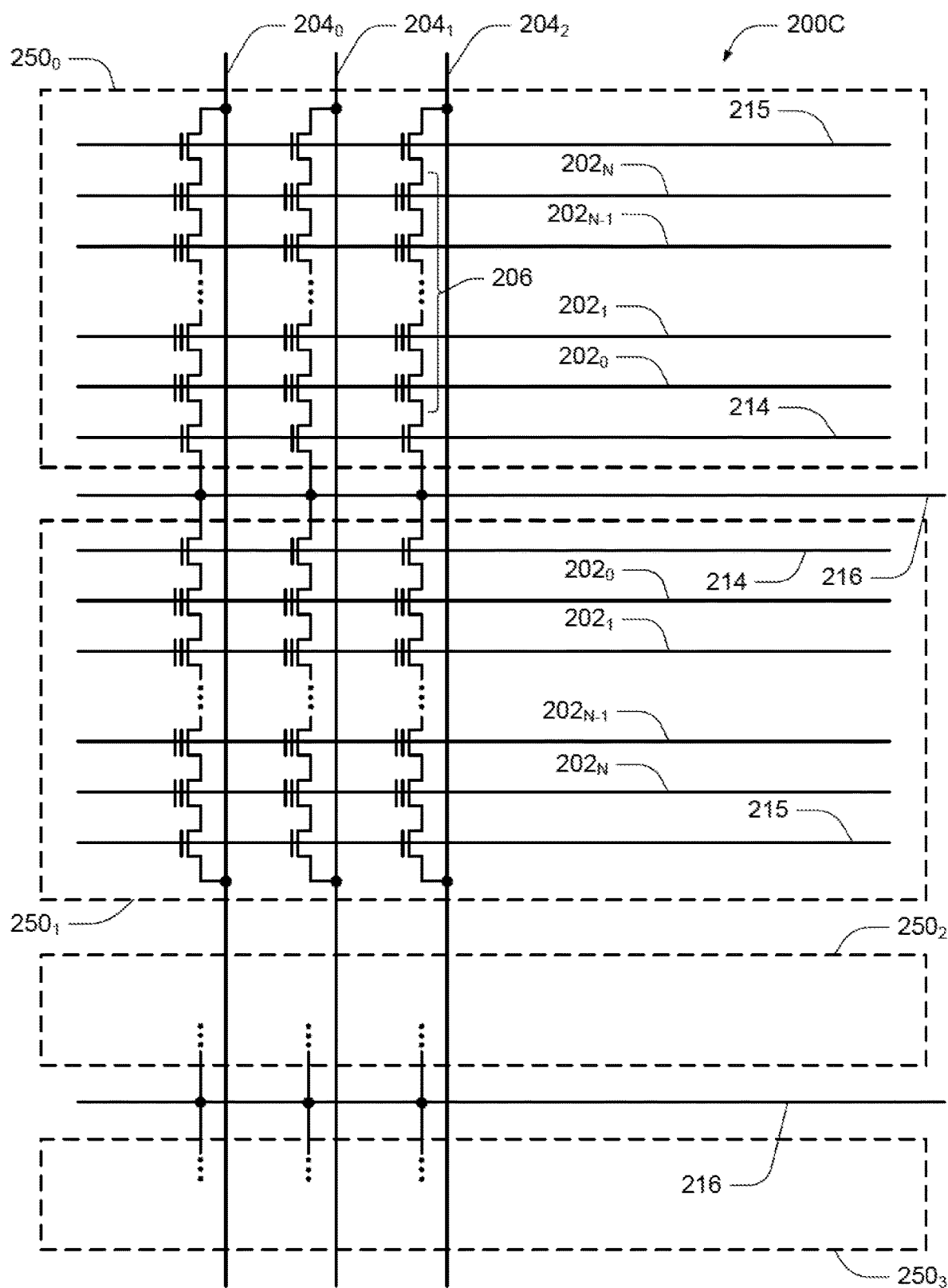

FIG. 2C is a further schematic of a portion of an array of memory cells 200C as could be used in a memory of the type described with reference to FIGS. 1, e.g., as a portion of array of memory cells 104. Like numbered elements in FIG. 2C correspond to the description as provided with respect to FIG. 2A. Array of memory cells 200C may include NAND strings 206, word lines 202, bit lines 204, source select lines 214, drain select lines 215 and common source 216 as depicted in FIG. 2A. The array of memory cells 200A may be a portion of the array of memory cells 200C, for example. FIG. 2C depicts groupings of NAND strings 206 into blocks of memory cells 250. Blocks of memory cells 250 may be groupings of memory cells 208 that may be erased together in a single erase operation, sometimes referred to as erase blocks.

Figure 3A:
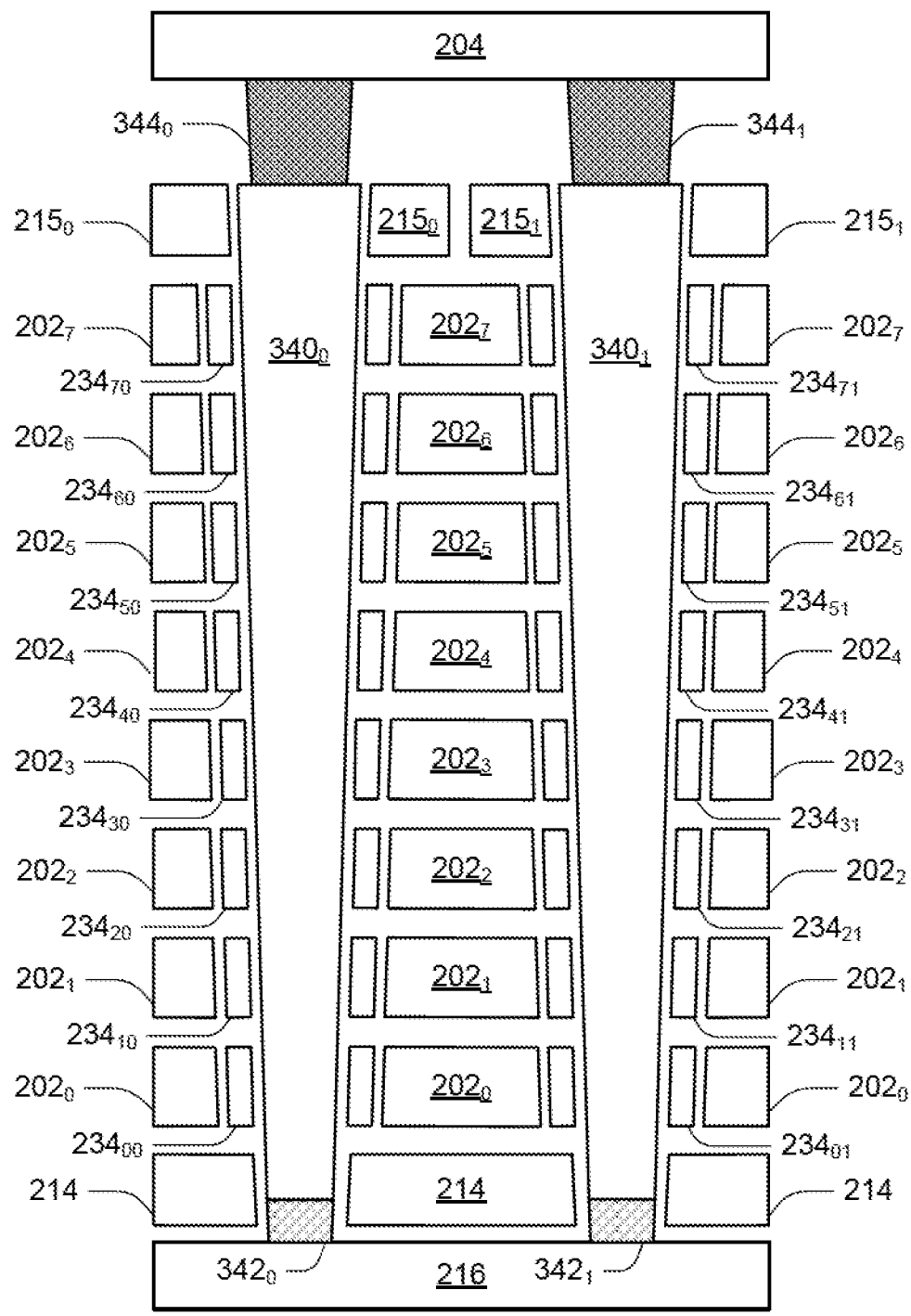
FIGS. 3A-3B are cross-sectional views of strings of series-connected memory cells as could be used in a memory of the type described with reference to FIG. 1.
Figure 3B:
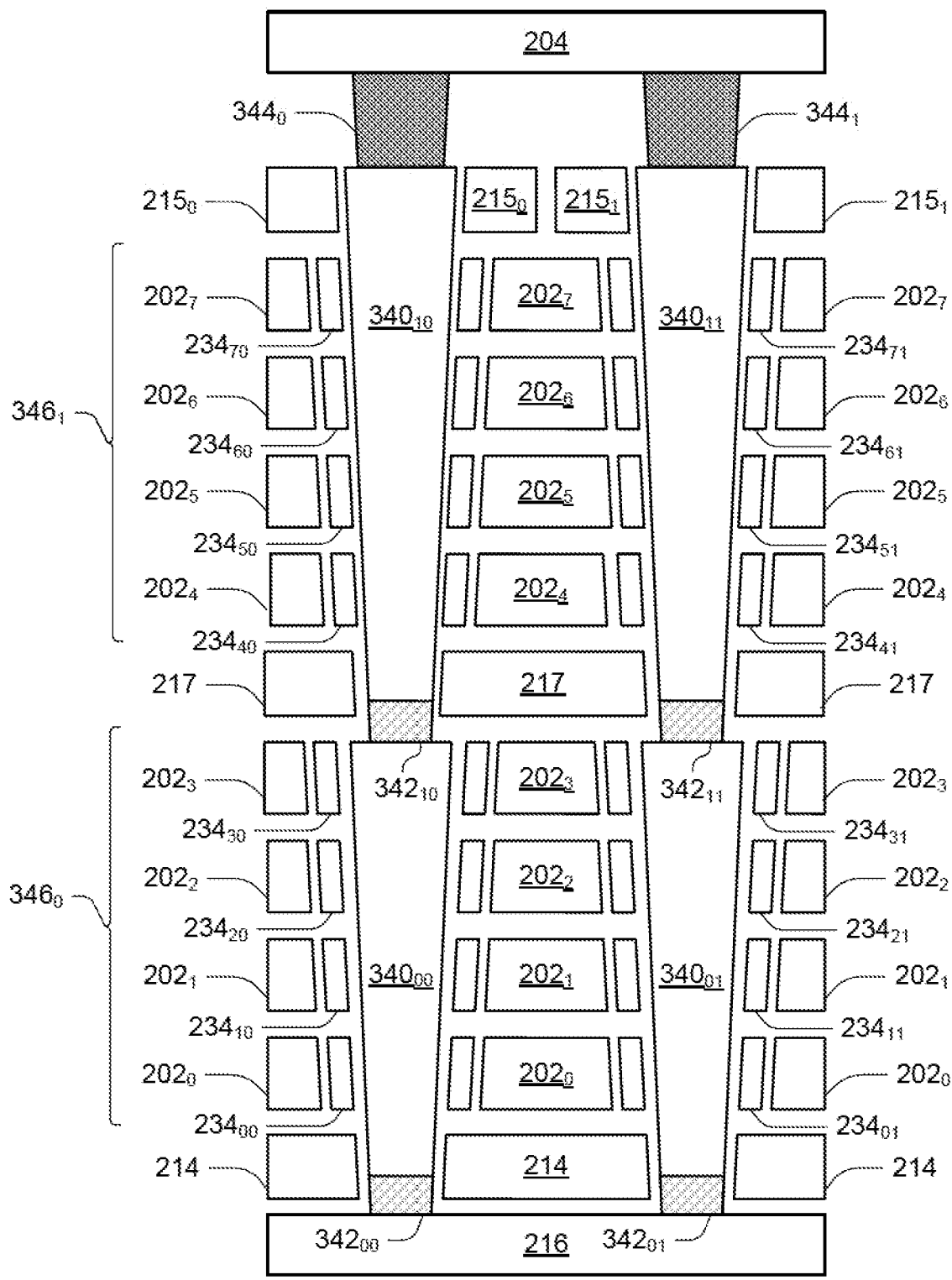

FIGS. 3A-3B are cross-sectional views of strings of series-connected memory cells as could be used in a memory of the type described with reference to FIG. 1. Three-dimensional memory arrays are typically fabricated by forming alternating layers of conductors and dielectrics, forming holes in these layers, forming additional materials on sidewalls of the holes to define gate stacks for memory cells and other gates, and subsequently filling the holes with a semiconductor material to define a pillar to act as bodies of the memory cells and select gates. To improve conductivity of pillars and an adjacent semiconductor material, e.g., upon which they are formed, a conductive (e.g., conductively-doped) portion is typically formed in the hole at an interface with the adjacent semiconductor material. These conductive portions are typically formed of a different conductivity type than the pillar and adjacent semiconductor material. For example, if the pillar is formed of a P-type semiconductor material, the conductive portion might have an N-type conductivity. FIG. 3A depicts a basic structure of strings of series-connected memory cells formed in this manner. In FIG. 3A, two strings of series-connected memory cells are depicted in the cross-sectional view. It is noted that the spaces between various elements of the figure may represent dielectric material.

With reference to FIG. 3A, a first NAND string includes a first pillar $340_0$. The first pillar $340_0$ may be formed of a semiconductor material of a first conductivity type, such as a P-type polysilicon. Conductive portion $342_0$ may be formed at the bottom of the pillar $340_0$, with the conductive portion $342_0$ electrically connected to the source 216. The conductive portion $342_0$ may be formed of a semiconductor material of a second conductivity type different than the first conductivity type. For the example where the first pillar $340_0$ might be formed of a P-type polysilicon, the conductive portion $342_0$ might be formed of an N-type semiconductor material, such as an N-type polysilicon. In addition, the conductive portion $342_0$ might have a higher conductivity level than the pillar $340_0$. For example, the conductive portion $342_0$ might have an N+ conductivity. Alternatively, the conductive portion $342_0$ may be formed of a conductor, e.g., a metal or metal silicide.

The pillar $340_0$ is electrically connected to the data line 204 through a conductive plug $344_0$. The conductive plug $344_0$, in this example, might also be formed of a semiconductor material of the second conductivity type, and may likewise have a higher conductivity level than the pillar $340_0$. Alternatively, the conductive plug $344_0$ may be formed of a conductor, e.g., a metal or metal silicide. The first NAND string further includes a source select gate at an intersection of the source select line 214 and the pillar $340_0$, and a drain select gate at an intersection of the drain select line 215 and the pillar $340_0$. The first NAND string further includes a memory cell at an intersection of each of the access lines $202_0$-$202_7$ and the pillar $340_0$. These memory cells further include data-storage structures $234_{00}$-$234_{70}$. While the structure of FIG. 3A is depicted to include only eight access lines 202 in an effort to improve readability of the figure, a typical NAND structure might have significantly more access lines 202.

Although not all numbered, for clarity of FIG. 3A, data-storage structures 234 are depicted on both sides of the pillars 340. Individual data-storage structures 234 may wrap completely around their respective pillar 340, thus defining a data-storage structure 234 for a single memory cell. Alternatively, structures are known having segmented data-storage structures 234, such that more than one (e.g., two) memory cells are defined at each intersection of an access line 202 and a pillar 340. Embodiments described herein are independent of the number of memory cells defined around a pillar 340.

With further reference to FIG. 3A, a second NAND string includes the second pillar $340_1$. The second pillar $340_1$ may be formed of a semiconductor material of the first conductivity type, such as a P-type polysilicon. Conductive portion $342_1$ may be formed at the bottom of the pillar $340_1$ with the conductive portion $342_1$ electrically connected to the source 216. The conductive portion $342_1$ may be formed of a semiconductor material of the second conductivity type. For the example where the pillar $340_1$ might be formed of a P-type polysilicon, the conductive portion $342_1$ might be formed of an N-type semiconductor material, such as an N-type polysilicon. In addition, the conductive portion $342_1$ might have a higher conductivity level than the pillar $340_1$. For example, the conductive portion $342_1$ might have an N+ conductivity.

The pillar $340_1$ is electrically connected to the data line 204 through a conductive plug $344_1$. The conductive plug $344_1$, in this example, might also be formed of a semiconductor material of the second conductivity type, and may likewise have a higher conductivity level than the pillar $340_1$. Alternatively, the conductive plug $344_1$ may be formed of a conductor, e.g., a metal or metal silicide. The second NAND string further includes a source select gate at an intersection of the source select line 214 and the pillar $340_1$, and a drain select gate at an intersection of the drain select line 215 and the pillar $340_1$. The second NAND string further includes a memory cell at an intersection of each of the access lines $202_0$-$202_7$ and the pillar $340_1$. These memory cells further include data-storage structures $234_{01}$-$234_{71}$.

Forming holes through multiple layers typically produces holes of decreasing diameter toward the bottom of the holes due to the nature of the removal processes commonly used in the semiconductor industry. To mitigate against the holes becoming too narrow, formation of arrays of the type described with reference to FIGS. 2A-2C, might be segmented, such that the layers for forming a first portion of the NAND string may be formed, then portions may be removed to define holes, and the remaining structures may be formed within the holes. Following formation of the first portion of the NAND string, a second portion of the NAND string might be formed over the first portion in a similar manner. FIG. 3B depicts a structure of this type. In FIG. 3B, two strings of series-connected memory cells are depicted in the cross-sectional view. It is noted that the spaces between various elements of the figure may represent dielectric material.

With reference to FIG. 3B, a first NAND string includes a first pillar section $340_{00}$ and a second pillar section $340_{10}$. The first pillar section $340_{00}$ and the second pillar section $340_{10}$ may each be formed of a semiconductor material of a first conductivity type, such as a P-type polysilicon. Conductive portions $342_{00}$ and $342_{10}$ may be formed at the bottoms of the pillar sections $340_{00}$ and $340_{10}$, respectively, with the conductive portion $342_{00}$ electrically connected to the source 216 and the conductive portion $342_{10}$ electrically connected to the pillar section $340_{00}$. The conductive portions $342_{00}$ and $342_{10}$ may be formed of a semiconductor material of a second conductivity type different than the first conductivity type. For the example where the first pillar section $340_{00}$ and the second pillar section $340_{10}$ may each be formed of a P-type polysilicon, the conductive portions $342_{00}$ and $342_{10}$ might be formed of an N-type semiconductor material, such as an N-type polysilicon. In addition, the conductive portions $342_{00}$ and $342_{10}$ might have a higher conductivity level than the pillar sections $340_{00}$ and $340_{10}$. For example, the conductive portions $342_{00}$ and $342_{10}$ might have an N+ conductivity. Alternatively, the conductive portions $342_{00}$ and $342_{10}$ may be formed of a conductor, e.g., a metal or metal silicide.

The pillar section $340_{10}$ is electrically connected to the data line 204 through a conductive plug $344_0$. The conductive plug $344_0$, in this example, might also be formed of a semiconductor material of the second conductivity type, and may likewise have a higher conductivity level than the pillar sections $340_{00}$ and $340_{10}$. Alternatively, the conductive plug $344_0$ may be formed of a conductor, e.g., a metal or metal silicide. The first NAND string further includes a source select gate at an intersection of the source select line 214 and the pillar section $340_{00}$, and a drain select gate at an intersection of the drain select line 215 and the pillar section $340_{10}$. The first NAND string further includes a memory cell at an intersection of each of the access lines $202_0$-$202_7$ and the pillar sections $340_{00}$ and $340_{10}$. These memory cells further include data-storage structures $234_{00}$-$234_{70}$. While the structure of FIG. 3B is depicted to include only eight access lines 202 in an effort to improve readability of the figure, a typical NAND structure might have significantly more access lines 202.

Although not all numbered, for clarity of FIG. 3B, data-storage structures 234 are depicted on both sides of the pillar sections 340. Individual data-storage structures 234 may wrap completely around their respective pillar section 340, thus defining a data-storage structure 234 for a single memory cell. Alternatively, structures are known having segmented data-storage structures 234, such that more than one (e.g., two) memory cells are defined at each intersection of an access line 202 and a pillar section 340. Embodiments described herein are independent of the number of memory cells defined around a pillar section 340. To improve the conductivity across the conductive portion $342_{10}$, the first NAND string may further include an intermediate gate at an intersection of the select line 217.

With further reference to FIG. 3B, a second NAND string includes the first pillar section $340_{01}$ and a second pillar section $340_{11}$. The first pillar section $340_{01}$ and a second pillar section $340_{11}$ may each be formed of a semiconductor material of the first conductivity type, such as a P-type polysilicon. Conductive portions $342_{01}$ and $342_{11}$ may be formed at the bottoms of the pillar sections $340_{01}$ and $340_{11}$, respectively, with the conductive portion $342_{01}$ electrically connected to the source 216 and the conductive portion $342_{11}$ electrically connected to the pillar section $340_{01}$. The conductive portions $342_{01}$ and $342_{11}$ may be formed of a semiconductor material of the second conductivity type. For the example where the first pillar section $340_{01}$ and a second pillar section $340_{11}$ may each be formed of a P-type polysilicon, the conductive portions $342_{01}$ and $342_{11}$ might be formed of an N-type semiconductor material, such as an N-type polysilicon. In addition, the conductive portions $342_{01}$ and $342_{11}$ might have a higher conductivity level than the pillar sections $340_{01}$ and $340_{11}$. For example, the conductive portions $342_{01}$ and $342_{11}$ might have an N+ conductivity.

The pillar section $340_{11}$ is electrically connected to the data line 204 through a conductive plug $344_1$. The conductive plug $344_1$, in this example, might also be formed of a semiconductor material of the second conductivity type, and may likewise have a higher conductivity level than the pillar sections $340_{01}$ and $340_{11}$. Alternatively, the conductive plug $344_1$ may be formed of a conductor, e.g., a metal or metal silicide. The second NAND string further includes a source select gate at an intersection of the source select line 214 and the pillar section $340_{01}$, and a drain select gate at an intersection of the drain select line 215 and the pillar section $340_{11}$. The second NAND string further includes a memory cell at an intersection of each of the access lines $202_0$-$202_7$ and the pillar sections $340_{01}$ and $340_{11}$. These memory cells further include data-storage structures $234_{01}$-$234_{71}$. To improve the conductivity across the conductive portion $342_{11}$, the second NAND string may further include an intermediate gate at an intersection of the select line 217 and the pillar section $340_{11}$. As technology changes, there may be a desire to form pillar sections 340 having smaller lateral dimensions, or there may be a desire to form NAND strings with increasing numbers of memory cells. Both situations may lead to forming the NAND strings using more than two pillar sections 340. A plurality of pillar sections 340 electrically connected between a bit line 204 and a source 216 (e.g., pillar sections $340_{00}$ and $340_{10}$ of FIG. 3B) may be collectively referred to simply as a pillar 340.

Figure 4A:
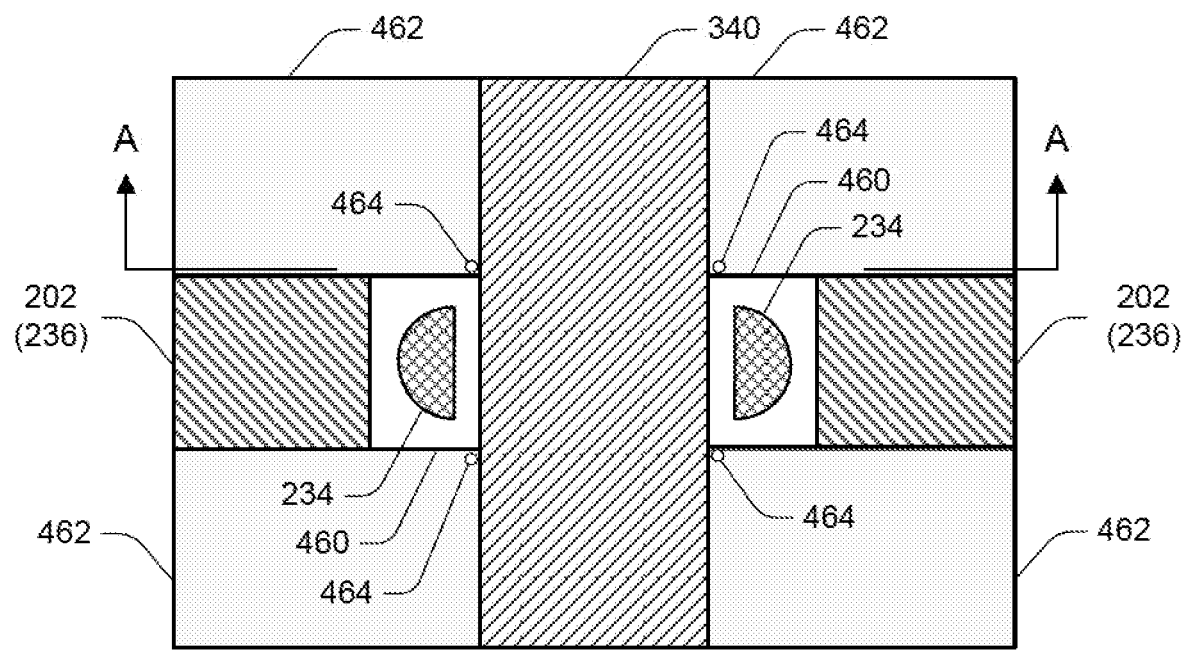
FIGS. 4A-4F are cross-sectional views of a portion of a string of series-connected memory cells depicting various states of mobile ions for reference in describing various embodiments.
Figure 4B:
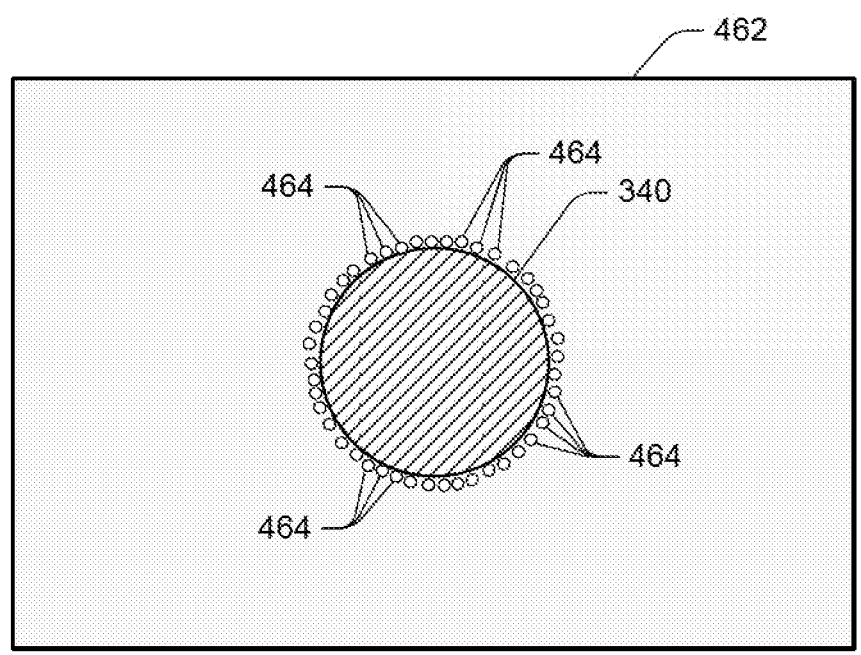
Figure 4C:
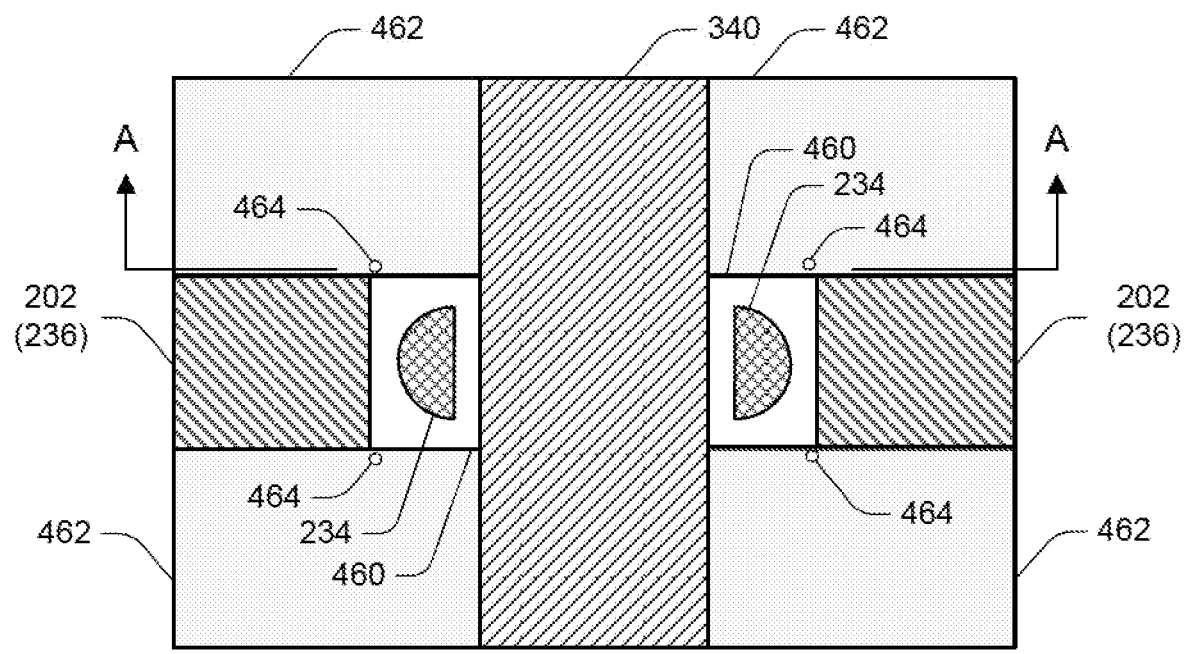
Figure 4D:
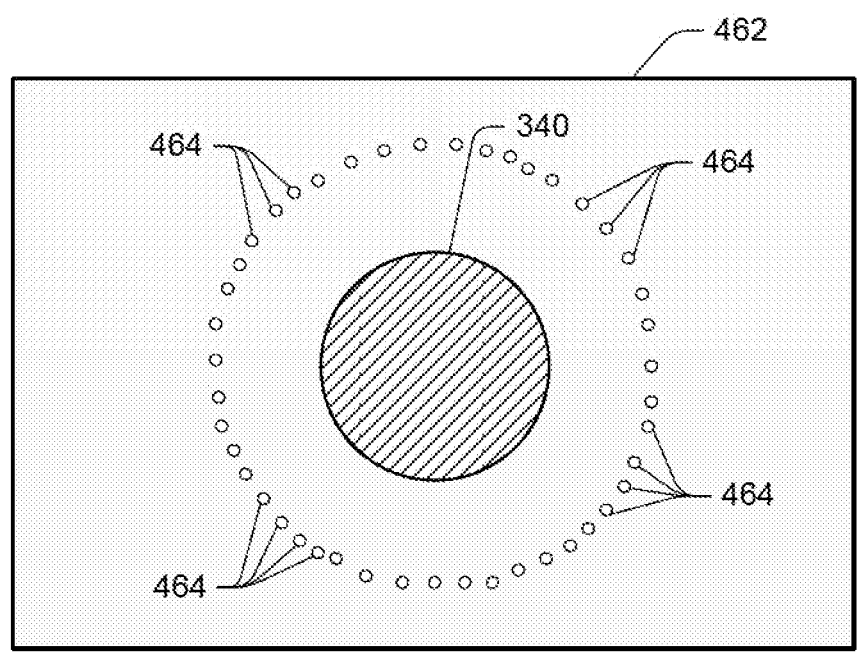
Figure 4E:
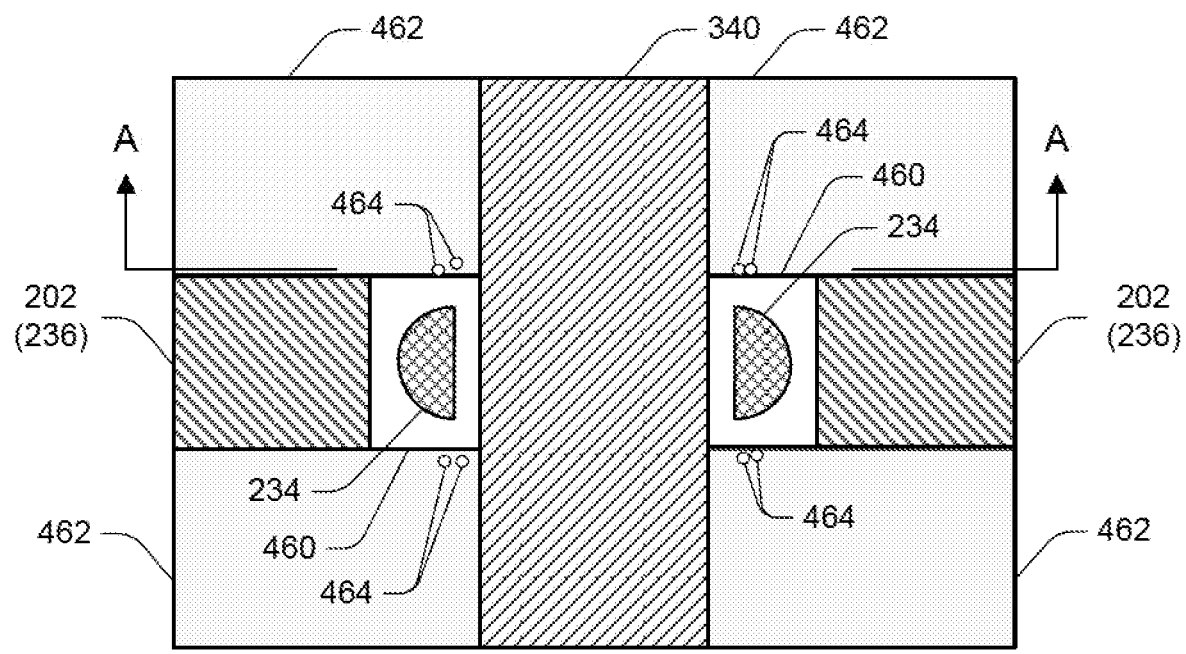
Figure 4F:
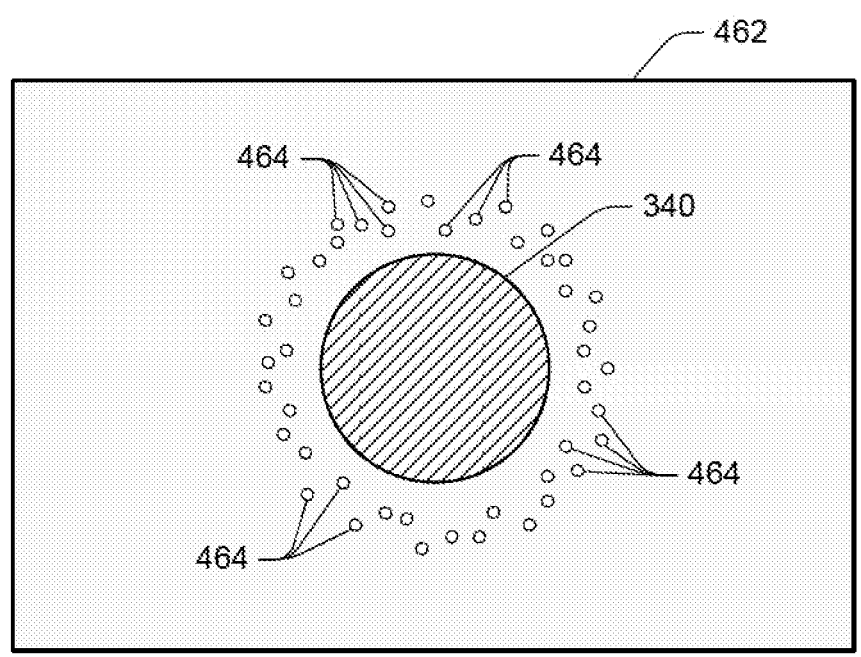

FIGS. 4A-4F are cross-sectional views of a portion of a string of series-connected memory cells depicting various states of mobile ions for reference in describing various embodiments. FIGS. 4A, 4C and 4E may represent cross-sectional views taken along a similar plane as used for the strings of series-connected memory cells depicted in FIGS. 3A-3B. FIGS. 4B, 4D and 4F may represent cross-sectional views of FIGS. 4A, 4C and 4E, respectively, taken along lines A-A of each respective figure.

FIGS. 4A, 4C and 4E each depict a word line 202 (e.g., control gate 236), a data storage structure 234, and a semiconductor pillar 340, as well as dielectrics 460 and 462 used to separate the data storage structure 234 and the word line 202 from adjacent conductive or semiconductive structures. For example, the word line 202 and data storage structure of FIGS. 4A, 4C and 4E might represent word line $202_5$ and data storage structure $234_{50}$ of FIG. 3B, respectively. In this example, the dielectric 460 surrounding the charge storage structure 234 of FIGS. 4A, 4C and 4E might represent dielectric in the spaces surrounding the data storage structure $2345_0$ of FIG. 3B. Similarly, the dielectric 462 on either side of word line 202 of FIGS. 4A, 4C and 4E might represent dielectric in the spaces between word lines $202_5$ and $202_6$ of FIG. 3B, and between word lines $202_5$ and $202_4$ of FIG. 3B. FIGS. 4B, 4D and 4F show the cross-section of the dielectric 462 and the semiconductor pillar 340 taken along line A-A.

FIGS. 4A-4F further depict ions (e.g., negative ions) 464. FIGS. 4A-4B depict the ions 464 in an expected stable state. For example, following erasure of a memory cell formed at the intersection of the word line 202 and semiconductor pillar 340, or long periods of data retention without access, the ions 464 may be concentrated near, or absorbed on, the semiconductor pillar 340.

FIGS. 4C-4D depict the ions 464 in a possible transient state, e.g., after establishing a negative body potential for a memory cell formed at the intersection of the word line 202 and semiconductor pillar 340. FIGS. 4C-4D might represent a possible transient state for a situation where the data storage structure 234 of the memory cell stores a data value corresponding to a high threshold voltage range, e.g., the highest threshold voltage range representing a data value of a plurality of possible data values stored by the memory cell. In such a situation, the number of electrons stored in the data storage structure 234 may assist movement of the ions 464 away from the semiconductor pillar 340. In this manner, the adverse effect on the effective threshold voltage of the memory cell of the stable state depicted in FIGS. 4A-4B may be mitigated.

FIGS. 4E-4F depict the ions 464 in a different possible transient state, e.g., after establishing a negative body potential for a memory cell formed at the intersection of the word line 202 and semiconductor pillar 340. FIGS. 4E-4F might represent a possible transient state for a situation where the data storage structure 234 of the memory cell stores a data value corresponding to a lower threshold voltage range than the example of FIGS. 4C-4D. In such a situation, with fewer electrons stored in the data storage structure 234, movement of the ions 464 away from the semiconductor pillar 340 may be less. However, the adverse effect on the effective threshold voltage of the memory cell of the stable state depicted in FIGS. 4A-4B may still be mitigated, albeit possibly to a lesser extent than the situation depicted in FIGS. 4E-4F.

Figure 5A:
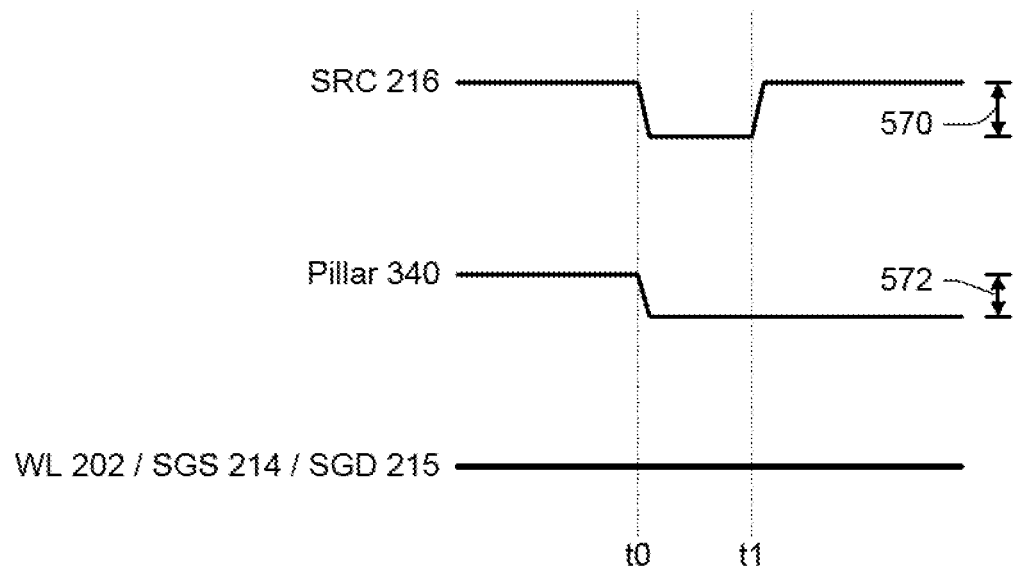
FIGS. 5A-5B are timing diagrams depicting methods of operating a memory in accordance with embodiments.
Figure 5B:
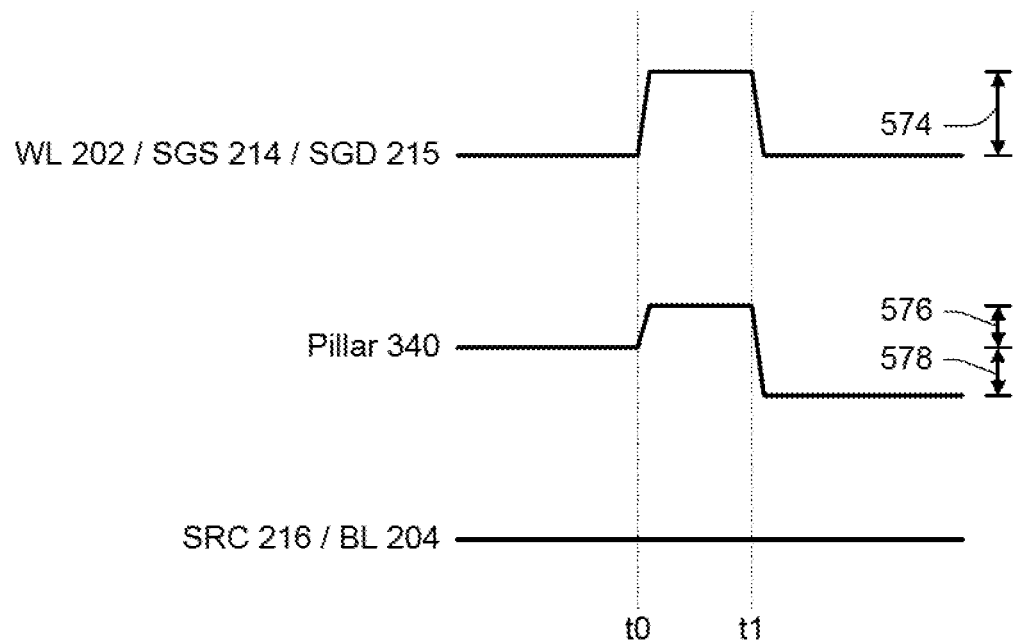

FIGS. 5A-5B are timing diagrams depicting methods of operating a memory in accordance with embodiments. FIGS. 5A-5B depict two examples of method of establishing a negative potential in a body of a memory cell of a structure of the type depicted in FIG. 3A. Similar results might be obtained for a structure of the type depicted in FIG. 3B by applying a similar (e.g., the same) voltage level to the select line 217 as are shown for application to the select lines 214 and 215 in FIGS. 5A-5B. It is noted that the methods depicted in FIGS. 5A-5B may establish a negative potential on the bodies of memory cells formed at the intersection of the word lines 202 and a plurality of pillars 340, which might include all pillars 340 connected to the source 216.

In FIG. 5A, the word lines 202 and the select lines 214 and 215 might maintain an initial voltage level. For example, the initial voltage level of the word lines 202 and the select lines 214 and 215 might be a reference potential, e.g., ground, 0V or Vss. The word lines 202 and the select lines 214 and 215 might represent all word lines and select lines between a bit line 204 and the source 216. An initial voltage level of the source 216 is transitioned lower at time t0. For example, the initial voltage level of the source 216 might be the reference potential, e.g., ground, 0V or Vss. The voltage level 570 might be some negative voltage level. Higher magnitudes of a negative voltage level 570 may provide more movement of the mobile ions away from the body of the memory cells, but also come with increased power requirements. Although choice of the magnitude of a negative voltage level 570 may be a compromise between power usage and level of mitigation of threshold voltage effects of the mobile ions, a voltage level 570 of −2V to −3V may result in sufficient mobility of the ions for adequate mitigation within structures of the type described herein.

In response to the transition of the voltage level of the source 216 at time t0, the voltage level of the pillar 340 might be reduced from an initial voltage level (e.g., the reference potential) by a voltage difference 572 due to capacitive coupling. The voltage difference 572 might be some negative voltage level. The voltage difference 572 might further have a lesser magnitude than the voltage level 570, e.g., due to the p-n junction of a conductive portion 342 between a pillar 340 and the source 216. For polysilicon structures, this difference might be 0.7V, such that if the voltage level 570 is −2V to −3V, the voltage level 572 might be −1.2V to −2.3V. The method depicted in FIG. 5A might be performed prior to sensing a memory cell selectively connected to the source 216, e.g., immediately prior to sensing that memory cell, or on a periodic basis. For some embodiments, sensing of a memory cell selectively connected to the source 216 is initiated while the voltage level of the pillar 340 is negative. While the example of FIG. 5A applied the same voltage level to the word lines 202 and the select lines 214 and 215, differing voltage levels might be used provided a negative voltage difference 572 is maintained on the pillar 340 following transition of the voltage level of the source 216 at time t1, such as by removing the voltage level 570.

In FIG. 5B, the source 216 and bit 204 might maintain an initial voltage level. For example, the initial voltage level of the source 216 and bit 204 might be a reference potential, e.g., ground, 0V or Vss. An initial voltage level of the word lines 202 and the select lines 214 and 215 is transitioned higher at time t0. For example, the initial voltage level of the word lines 202 and the select lines 214 and 215 might be the reference potential, e.g., ground, 0V or Vss. The voltage difference 574 might be some positive voltage level. For some embodiments, where the initial voltage level is the reference potential, the voltage level of the word lines 202 and the select lines 214 and 215 may be transitioned to a supply voltage Vcc. The supply voltage Vcc may have a nominal level of 3.3V, and a range of 2.7V-3.6V, as one example of an existing standard. Higher magnitudes of a positive voltage difference 574 may provide more movement of the mobile ions away from the body of the memory cells, but also come with increased power requirements.

In response to the transition of the voltage level of the word lines 202 and select lines 214 and 215 at time t0, the voltage level of the pillar 340 might be increased from an initial voltage level (e.g., the reference potential) by a voltage difference 576 due to capacitive coupling. The voltage difference 576 might be some positive voltage level. The voltage difference 576 might further have a lesser magnitude than the voltage difference 574, e.g., due to the p-n junction of a conductive portion 342 between a pillar 340 and the source 216. For polysilicon structures, this difference might be 0.7V.

At time t1, the voltage level of the word lines 202 and the select lines 214 and 215 is transitioned lower, e.g., applying the reference potential. In response to the transition of the voltage level of the word lines 202 and select lines 214 and 215 at time t1, the voltage level of the pillar 340 might be decreased by a voltage difference of the sum of the voltage difference 576 and a voltage difference 578 due to capacitive coupling. The voltage difference 578 might be some negative voltage level. The voltage difference 578 might further have a lesser magnitude than the voltage difference 574, e.g., due to the p-n junction of a conductive portion 342 between a pillar 340 and the source 216. For polysilicon structures, this difference might be 0.7V, such that if the voltage difference 574 is 3.3V, the voltage difference 578 might be −2.6V. The method depicted in FIG. 5B might be performed prior to sensing a memory cell selectively connected to the source 216, e.g., immediately prior to sensing that memory cell, on a periodic basis, or during access operations on other memory cells. For some embodiments, sensing of a memory cell selectively connected to the source 216 may be initiated while the voltage level of the pillar 340 is negative. While the example of FIG. 5B applied the same voltage level to the source 216 and bit line 204, differing voltage levels might be used provided a negative voltage difference 578 is maintained on the pillar 340 following transition of the voltage level of the word lines 202 and select lines 214 and 215 at time t1.

Figure 6A:
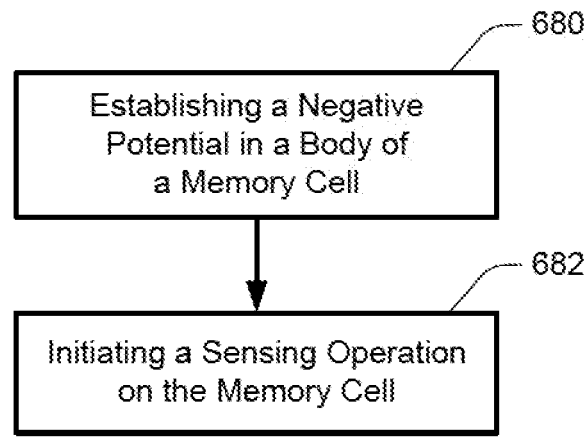
FIGS. 6A-6B are flowcharts of methods of operating a memory in accordance with embodiments.
Figure 6B:
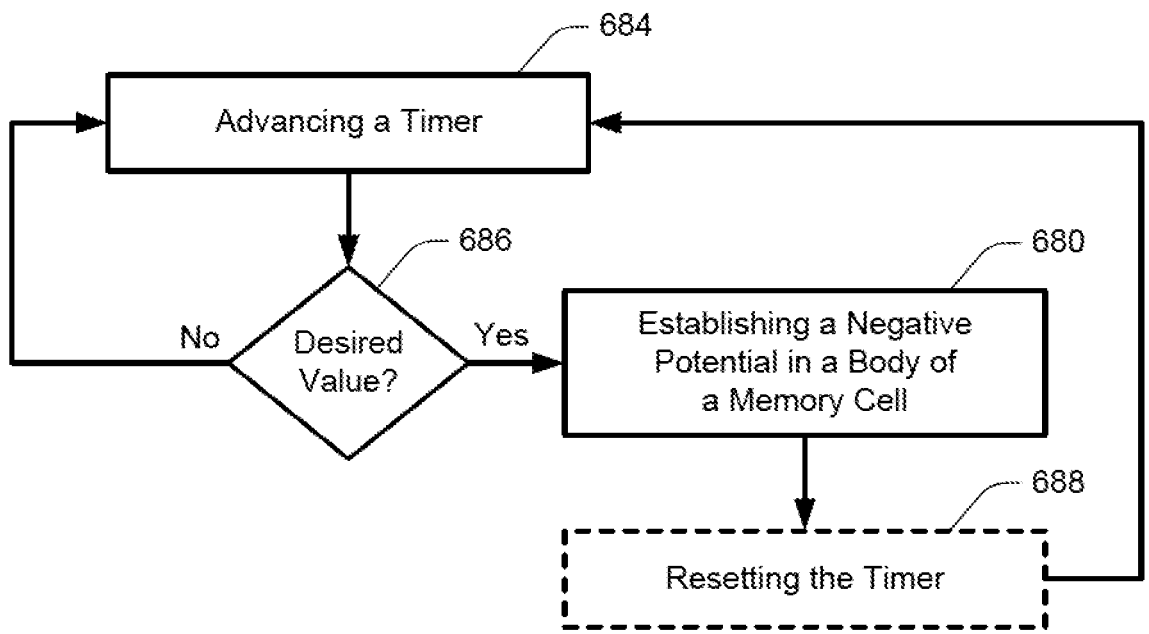

FIGS. 6A-6B are flowcharts of methods of operating a memory in accordance with embodiments. With reference to FIG. 6A, a negative potential is established in a body of a memory cell at 680. For example, a negative potential might be established in a pillar 340 as described with reference to FIGS. 5A-5B. At 682, a sensing operation (e.g., a read operation) is initiated on the memory cell to determine a data value stored by the memory cell. The sensing operation may be initiated while the body of the memory cell is still at a negative potential. The method of FIG. 6A might be performed in response to commands from an external device, e.g., an external controller. For example, a first command might initiate the process of 680 while a second command might initiate the sensing operation at 682. Alternatively, the process of 680 might be performed in response to a timer as discussed in more detail with regard to FIG. 6B, or in conjunction with an access operation (e.g., an erase operation) on another memory cell as discussed in more detail with regard to FIGS. 7 and 8.

A sensing operation in a NAND memory typically involves applying a voltage level (e.g., a read voltage) to a selected access line connected to a selected memory cell of a string of series-connected memory cells, and applying different voltage levels (e.g., pass voltages) to access lines connected to each remaining memory cell of the string of series-connected memory cells. For example, the read voltage might be sufficient to activate the selected memory cell if it has a threshold voltage corresponding to one or more possible data states and insufficient to activate the selected memory cell if it has a threshold voltage corresponding to at least one of the possible data states, while the pass voltages might each be sufficient to activate any memory cell of the string of series-connected memory cells regardless of which of the possible data states those memory cells have been programmed to store.

With reference to FIG. 6B, a timer is advanced at 684. At 686, a determination is made whether the timer has a desired value. For example, where the timer outputs a count value representative of an elapsed time, the desired value may represent a particular value of the count. Advancing the timer might include advancing a counter, which might include incrementing or decrementing the value of the count. Alternatively, where the timer outputs a signal and toggles a logic level of that output signal from a first value to a second value when a particular interval of time has elapsed, the desired value may represent the second value of the logic level. Advancing the timer in such embodiments might include incrementing or decrementing the elapsed time.

If the timer has the desired value at 686, a negative potential is established in a body of a memory cell at 680.

For embodiments where the timer is in communication with a device external to the memory, e.g., an external controller, the process of 680 may be initiated in response to a command from the external device. If the timer does not have the desired value at 686, the process returns to 684 to continue advancing the timer. For embodiments where the desired value of the timer represents a count value, the timer might be reset to an initial value at 688 before returning to advancing the timer at 684. An embodiment of FIG. 6B might be used to facilitate maintaining mobile ions in a transient state, e.g., inhibiting the mobile ions from obtaining the stable state. As an example, a timer value corresponding to 10 minutes might facilitate maintaining mobile ions in a transient state. The desired value may be stored in the memory, e.g., in one or more memory cells of the memory, or in the external device when the timer is external to the memory. In addition, a temperature sensor may be utilized to modify the desired value of the timer. For example, the desired value may be changed to represent an increased amount of time if the temperature sensor indicates a temperature higher than an upper threshold, and may be changed to represent a decreased amount of time if the temperature sensor indicates a temperature lower than a lower threshold. For some embodiments, the upper threshold and the lower threshold might have the same value.

Figure 7:
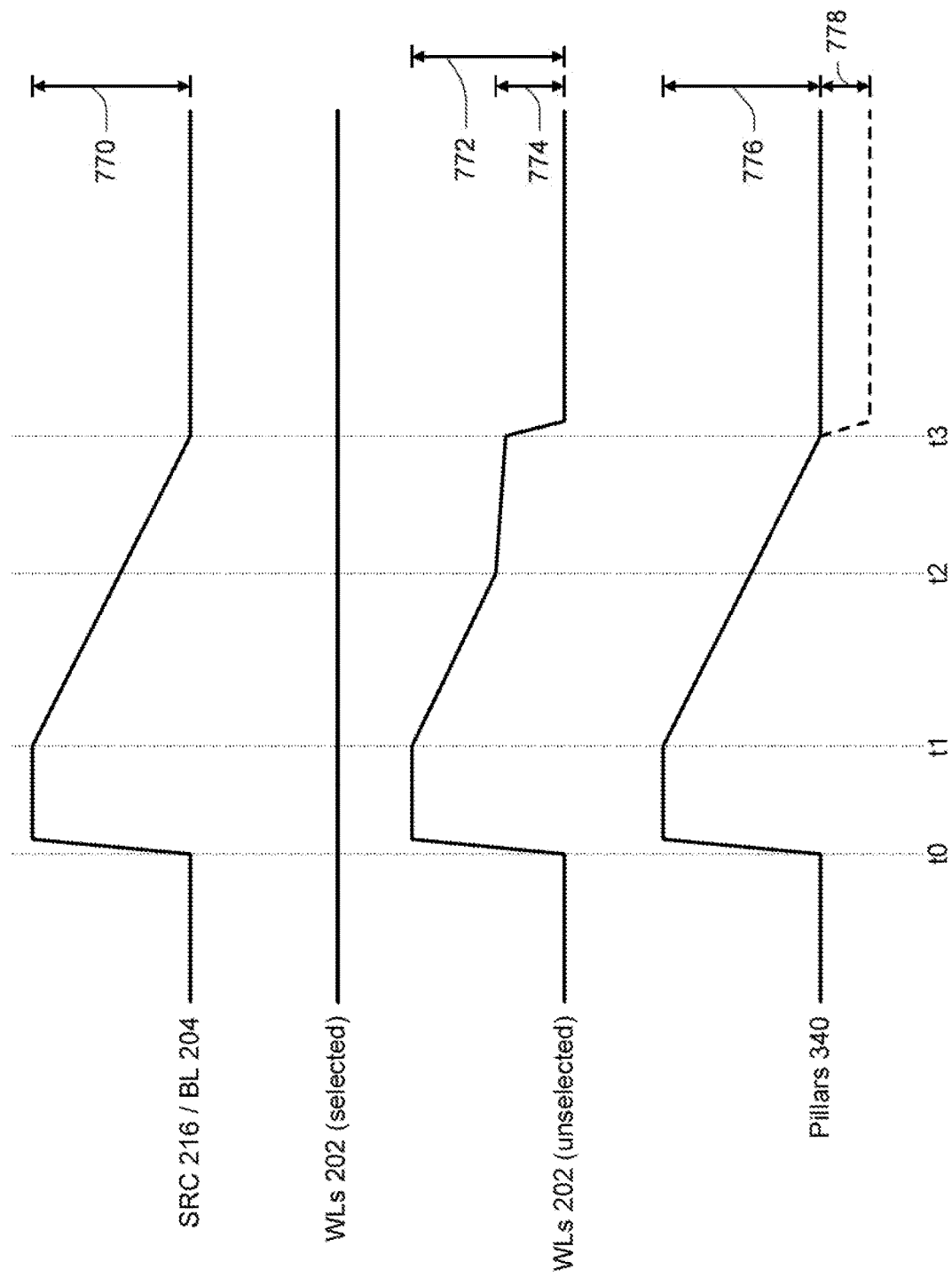
FIG. 7 is a timing diagram depicting a method of operating a memory in accordance with an embodiment.

FIG. 7 is a timing diagram depicting a method of operating a memory in accordance with an embodiment. For example, the method of FIG. 7 might represent an erase operation on a selected block of memory cells, e.g., block of memory cells $250_0$ of FIG. 2C. One or more blocks of memory cells not selected for the erase operation may share a source 216 with the selected block of memory cells, e.g., block of memory cells $250_1$ of FIG. 2C.

With reference to FIG. 7, the voltage level of the word lines 202 of the selected block of memory cells (e.g., selected word lines 202) might maintain an initial voltage level. For example, the initial voltage level of the selected word lines 202 might be a reference potential, e.g., ground, 0V or Vss. An initial voltage level of the source 216 and bit line 204 is transitioned to a higher voltage level at time t0. For example, the initial voltage level of the source 216 and the bit line 204 might be the reference potential, e.g., ground, 0V or Vss. The voltage difference 770 might be some positive voltage level that would be expected to decrease a threshold voltage (e.g., remove electrons from data storage structures) of memory cells connected to the selected word lines 202 while they are maintained at their voltage level. For example, where the selected word lines 202 receive the reference potential, the voltage difference 770 might be on the order of 20-25V. Although not shown in FIG. 7, voltage levels applied to select lines (e.g., 214 and 215) of the selected block of memory cells might be some value or values suitable to generate gate induced drain leakage (GIDL) into the pillars 340 of the selected block of memory cells. In addition, different word lines 202 may maintain different voltage levels. For example, one or more edge word lines 202 (e.g., word lines $202_0$, $202_1$, $202_{N-1}$ and/or $202_N$ of FIG. 2C) might maintain a higher voltage level than other word lines 202. Furthermore, while the source 216 and the bit line 204 are depicted to apply the same voltage levels, differing voltage levels may also be used.

The word lines 202 of blocks of memory cells not selected for the erase operation (e.g., unselected word lines 202) might be permitted to electrically float at time t0. As a result of the voltage level applied to the source 216 and bit line 204, the pillars 340 of the selected block of memory cells and the unselected block(s) of memory cells might increase from an initial voltage level (e.g., the reference potential) by a voltage difference 776. The voltage difference 776 might have a lesser magnitude than the voltage difference 770, e.g., due to the p-n junction of a conductive portion 342 between a pillar 340 and the source 216. For polysilicon structures, this difference might be 0.7V. With the unselected word lines 202 electrically floating, they may also increase from their initial voltage level by a voltage difference 772 due to capacitive coupling to their respective pillars 340. The voltage difference 772 might have a lesser magnitude than the voltage difference 776 due to the coupling ratio between the word lines 202 and the pillars 340.

At time t1, discharge of the voltage level of the source 216 and the bit line 204 might begin. While the source 216 and bit line 204 are being discharged, the floating unselected word lines 202 and the pillars 340 of both the selected block of memory cells and the unselected block(s) of memory cells may also correspondingly experience a reduction in voltage levels.

At time t2, when the source 216 reaches a particular voltage level, the pillars 340 reach their corresponding voltage level, and/or the unselected word lines 202 reach their corresponding voltage level 774, an active voltage bias might be applied to the unselected word lines 202. For example, while the unselected word lines 202 were electrically floating from time t0 until time t2, active biasing of the unselected word lines 202 might begin at time t2. A particular voltage level might be applied to the unselected word lines 202 at time t2 to result in a voltage level of the unselected word lines 202 of substantially equal to (e.g., equal to) the voltage level 774. Such an applied voltage level may be less than the voltage level 774, with capacitive coupling to their respective pillars 340 bringing the effective voltage level of the unselected word lines 202 to the voltage level 774.

Between time t2 and time t3, the source 216 and the bit line 204 are permitted to continue discharging, resulting in the continued discharging of the pillars 340 as well. While the unselected word lines 202 are actively biased, they may also experience a reduction in their effective voltage level due to the capacitive coupling to their respective pillars 340. At time t3, e.g., when the source 216 returns to its initial voltage level, the applied voltage level of the unselected word lines 202 is reduced, e.g., reduced to the initial voltage level of the unselected word lines 202. While the pillars 340 associated with the selected word lines 202 might remain at their initial voltage level at time t3 (depicted as solid line), the pillars 340 associated with the unselected word lines 202 might experience a reduction in voltage level at time t3 (depicted as dashed line). For example, due to capacitive coupling to their associated unselected word lines 202, the voltage level of the pillars 340 associated with the unselected word lines 202 might experience a reduction by a voltage level 778.

Figure 8:
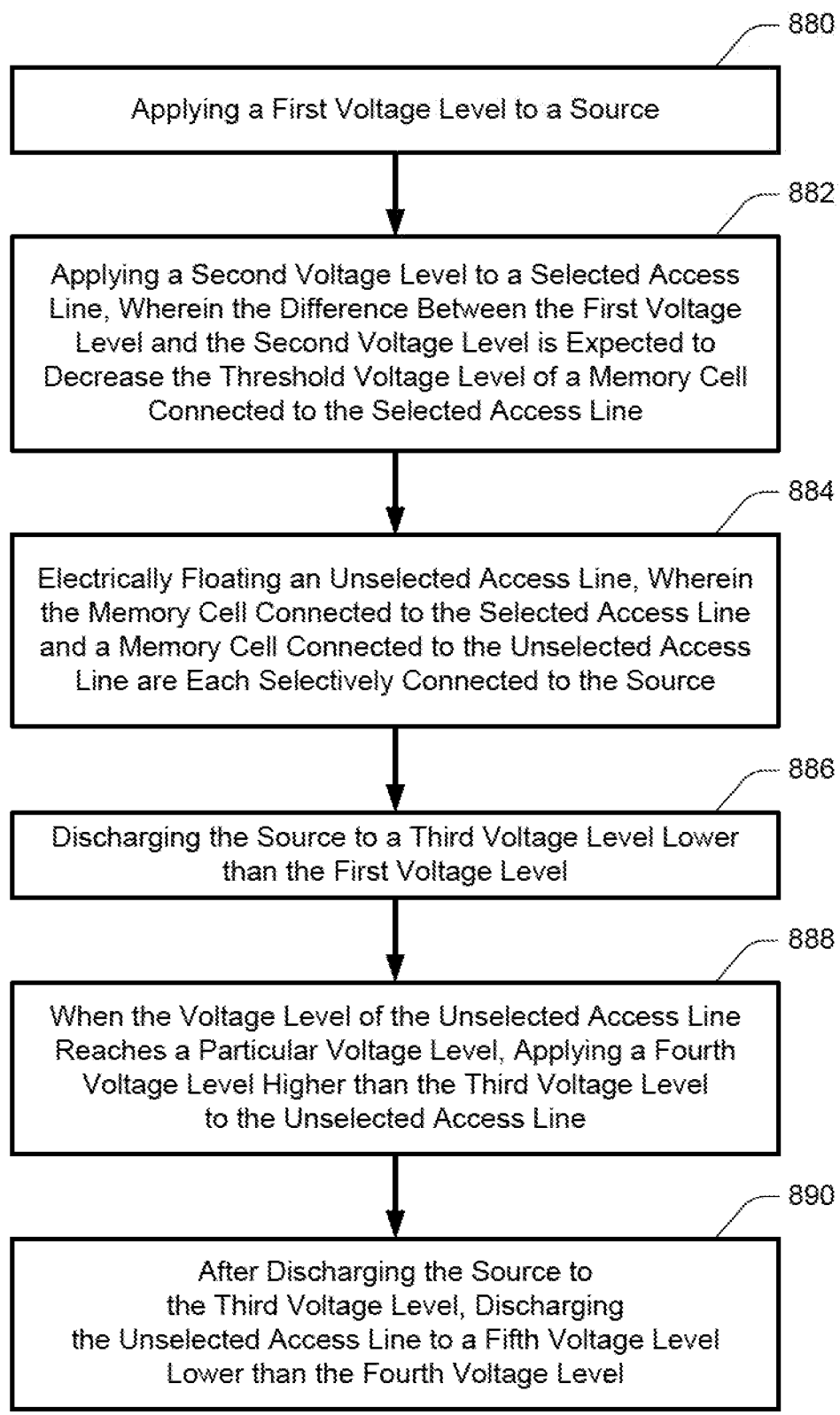
FIG. 8 is a flowchart of a method of operating a memory in accordance with an embodiment.

FIG. 8 is a flowchart of a method of operating a memory in accordance with an embodiment. At 880, a first voltage level is applied to a source, e.g., common source 216. At 882, a second voltage level is applied to a selected access line, e.g., a word line 202. The difference between the first voltage level and the second voltage level is expected to decrease the threshold voltage level of a memory cell, e.g., a memory cell 208, connected to the selected access line, e.g., such as by removing electrons from a data storage node of the memory cell. For example, the first voltage level might be an erase voltage of 20V-25V. The second voltage level might be a reference potential, e.g., ground, 0V or Vss.

At 884, an unselected access line, e.g., another word line 202, may be electrically floated. The memory cell connected to the selected access line and a memory cell connected to the unselected access line are each selectively connected to the source. All memory cells connected to the selected access line and all memory cells connected to the unselected access line may each be selectively connected to the source. Semiconductor pillars, e.g., pillars 340, adjacent to which such memory cells are formed, may be electrically connected to the source, e.g., through a p-n junction or other contact.

At 886, discharging of the source to a third voltage level, lower than the first voltage level, is initiated. When the voltage level of the unselected access line reaches a particular voltage level at 888, e.g., a particular voltage level between the first voltage level and the third voltage level, a fourth voltage level higher than the third voltage level may be applied to the unselected access line. The particular voltage level might be higher than or equal to the fourth voltage level, for example. Determining when the voltage level of the unselected access line reaches the particular voltage level may include, for example, measuring the voltage level of the unselected access line, waiting some predetermined length of time after initiating discharge of the source, measuring the voltage level of the source, or measuring the voltage level of a data line, e.g., bit line 204, selectively connected to a memory cell connected to the unselected access line.

At 890, after discharging the source to the third voltage level, the unselected access line may be discharged to a fifth voltage level less than the fourth voltage level. As an example, the fifth voltage level might be the reference potential, e.g., ground, 0V or Vss. The magnitude of the difference between the fourth voltage level and the fifth voltage level may be selected to produce a voltage drop, e.g., through capacitive coupling, in a semiconductor pillar associated with the unselected access line sufficient to produce a negative potential in the semiconductor pillar. For example, the difference from the fourth voltage level to the fifth voltage level may be around −2V to −4V. For some embodiments, the fourth voltage level might represent the supply voltage Vcc.

Methods such as described with reference to FIGS. 7-8 may establish negative body potentials in memory cells of blocks of memory cells not selected for an erase operation. This can be used to mitigate the effects of a large positive body potential that such unselected blocks of memory cells might experience during erase operations of the prior art, similar to what is shown in FIG. 7 from time t0 to time t1. Such a large positive body potential might move mobile ions to a stable state such as shown and described with reference to FIGS. 4A-4B. By establishing a negative body potential in unselected blocks of memory cells, a transient state of the mobile ions, such as shown and described with reference to FIGS. 4C-4D or FIGS. 4E-4F, might be obtained, which may facilitate a reduction in errors when sensing memory cells of the blocks of memory cells not selected for the erase operation.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art.

Accordingly, this application is intended to cover any adaptations or variations of the embodiments.

What is claimed is:

1. An apparatus, comprising:
   an array of memory cells arranged in strings of series-connected memory cells; and
   a controller to perform access operations on the array of memory cells;
   wherein the controller, during an erase operation on a selected string of series-connected memory cells of the array of memory cells selected for the erase operation, is configured to:
   apply a first voltage level to a source;
   apply a second voltage level to a selected access line connected to a memory cell of the selected string of series-connected memory cells, wherein a difference between the first voltage level and the second voltage level is expected to decrease a threshold voltage level of a memory cell connected to the selected access line;
   electrically float an unselected access line connected to a memory cell of an unselected string of series-connected memory cells while applying the first voltage level to the source, wherein the memory cell connected to the selected access line and the memory cell connected to the unselected access line are each selectively connected to the source;
   discharge the source to a third voltage level lower than the first voltage level;
   when a voltage level of the unselected access line reaches a particular voltage level while discharging the source to the third voltage level, apply a fourth voltage level higher than the third voltage level to the unselected access line; and
   after discharging the source to the third voltage level, discharge the unselected access line to a fifth voltage level lower than the fourth voltage level.

2. The apparatus of claim 1, wherein the controller being configured to discharge the unselected access line to the fifth voltage level lower than the fourth voltage level comprises the controller being further configured to discharge the unselected access line to the fifth voltage level equal to the third voltage level.

3. The apparatus of claim 2, wherein the controller being configured to discharge the source to the third voltage level lower than the first voltage level comprises the controller being further configured to discharge the source to the third voltage level equal to the second voltage level.

4. The apparatus of claim 3, wherein the controller being configured to apply the second voltage level to the selected access line comprises the controller being further configured to apply a reference potential to the selected access line.

5. The apparatus of claim 1, wherein the controller being configured to apply the second voltage level to the selected access line connected to the memory cell of the selected string of series-connected memory cells comprises the controller being configured to apply the second voltage level to a plurality of access lines including the selected access line, wherein each access line of the plurality of access lines is connected to a respective memory cell of the selected string of series-connected memory cells.

6. The apparatus of claim 5, wherein a number of memory cells of the selected string of series-connected memory cells is greater than a number of access lines of the plurality of access lines.

7. The apparatus of claim 6, wherein the controller is further configured to apply a voltage level higher than the second voltage level to a different access line connected to a different memory cell of the selected string of series-connected memory cells while applying the second voltage level to the plurality of access lines.

8. The apparatus of claim 7, wherein the different access line is between the plurality of access lines and a transistor selectively connecting the memory cell of the selected string of series-connected memory cells to the source.

9. The apparatus of claim 8, wherein the controller is further configured to apply a voltage level to a control gate of the transistor selected to induce gate-induced drain leakage (GIDL) while applying the first voltage level to the source and applying the second voltage level to the plurality of access lines.

10. The apparatus of claim 1, wherein a difference between the first voltage level and the second voltage level is expected to decrease a threshold voltage of the memory cell.

11. The apparatus of claim 1, wherein the controller is further configured to:
    apply the first voltage level to a data line while applying the first voltage level to the source; and
    discharge the data line to the third voltage level while discharging the source to the third voltage level;
    wherein the memory cell connected to the selected access line and the memory cell connected to the unselected access line are each selectively connected to the data line.

12. The apparatus of claim 1, wherein the controller being configured to apply the first voltage level to the source comprises the controller being configured to transition the source from the second voltage level to the first voltage level while applying the second voltage level to the selected access line.

13. The apparatus of claim 1, wherein the controller is further configured to determine when the voltage level of the unselected access line reaches the particular voltage level using a method selected from a group consisting of measuring the voltage level of the unselected access line, waiting a predetermined length of time after initiating discharge of the source, measuring the voltage level of the source, and measuring a voltage level of a data line selectively connected to the memory cells connected to the unselected access line.

* * * * *